(12) United States Patent
Wöhlte

(10) Patent No.: US 11,638,362 B2
(45) Date of Patent: Apr. 25, 2023

(54) VEHICULAR RADAR SENSOR WITH ENHANCED HOUSING AND PCB CONSTRUCTION

(71) Applicant: Magna Electronics Inc., Auburn Hills, MI (US)

(72) Inventor: Wilhelm Johann Wolfgang Wöhlte, Sailauf (DE)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 515 days.

(21) Appl. No.: 16/665,403

(22) Filed: Oct. 28, 2019

(65) Prior Publication Data
US 2020/0137913 A1 Apr. 30, 2020

Related U.S. Application Data

(60) Provisional application No. 62/751,940, filed on Oct. 29, 2018.

(51) Int. Cl.
| H05K 7/14 | (2006.01) |
| H05K 5/02 | (2006.01) |
| H01Q 1/32 | (2006.01) |
| G01S 13/931 | (2020.01) |
| G01S 7/03 | (2006.01) |
| G01S 7/02 | (2006.01) |

(52) U.S. Cl.
CPC .............. *H05K 7/1427* (2013.01); *G01S 7/03* (2013.01); *G01S 13/931* (2013.01); *H01Q 1/3208* (2013.01); *H05K 5/0217* (2013.01); *G01S 7/027* (2021.05); *G01S 2013/93271* (2020.01)

(58) Field of Classification Search
CPC .. H05K 7/1427; H05K 5/0052; G01S 13/931; G01S 7/028; G01S 2013/93271; G01S 2013/93275
See application file for complete search history.

(56) References Cited

U.S. PATENT DOCUMENTS

| 6,587,186 B2 | 7/2003 | Bamji et al. |
| 6,674,895 B2 | 1/2004 | Rafii et al. |
| 6,678,039 B2 | 1/2004 | Charbon |
| 6,690,354 B2 | 2/2004 | Sze |
| 6,710,770 B2 | 3/2004 | Tomasi et al. |
| 6,825,455 B1 | 11/2004 | Schwarte |
| 6,876,775 B2 | 4/2005 | Torunoglu |
| 6,906,793 B2 | 6/2005 | Bamji et al. |
| 6,919,549 B2 | 7/2005 | Bamji et al. |

(Continued)

FOREIGN PATENT DOCUMENTS

| WO | 2011090484 A1 | 7/2011 |
| WO | 2018007995 A1 | 1/2018 |

*Primary Examiner* — Vladimir Magloire
*Assistant Examiner* — Oladimeji Oyegunle
(74) *Attorney, Agent, or Firm* — Honigman LLP

(57) ABSTRACT

A vehicular radar sensing system includes a radar sensor disposed at a vehicle so as to sense exterior of the vehicle. The radar sensor includes a housing and at least one printed circuit board (PCB). The housing includes a front housing portion and a rear housing portion. The front housing portion includes side walls with a slot therealong. The PCB is received in the slot of the front housing portion. After the PCB is received in the slot, the front housing portion and the rear housing portion are joined to establish a cavity in which the PCB is disposed.

21 Claims, 9 Drawing Sheets

(56) References Cited

U.S. PATENT DOCUMENTS

| | | |
|---|---|---|
| 7,053,357 B2 | 5/2006 | Schwarte |
| 7,157,685 B2 | 1/2007 | Bamji et al. |
| 7,176,438 B2 | 2/2007 | Bamji et al. |
| 7,203,356 B2 | 4/2007 | Gokturk et al. |
| 7,212,663 B2 | 5/2007 | Tomasi |
| 7,283,213 B2 | 10/2007 | O'Connor et al. |
| 7,310,431 B2 | 12/2007 | Gokturk et al. |
| 7,321,111 B2 | 1/2008 | Bamji et al. |
| 7,340,077 B2 | 3/2008 | Gokturk et al. |
| 7,352,454 B2 | 4/2008 | Bamji et al. |
| 7,375,803 B1 | 5/2008 | Bamji |
| 7,379,100 B2 | 5/2008 | Gokturk et al. |
| 7,379,163 B2 | 5/2008 | Rafii et al. |
| 7,405,812 B1 | 7/2008 | Bamji |
| 7,408,627 B2 | 8/2008 | Bamji et al. |
| 8,013,780 B2 | 9/2011 | Lynam |
| 8,027,029 B2 | 9/2011 | Lu et al. |
| 9,036,026 B2 | 5/2015 | Dellantoni et al. |
| 9,146,898 B2 | 9/2015 | Ihlenburg et al. |
| 9,575,160 B1 | 2/2017 | Davis et al. |
| 9,599,702 B1 | 3/2017 | Bordes et al. |
| 9,689,967 B1 | 6/2017 | Stark et al. |
| 9,753,121 B1 | 9/2017 | Davis et al. |
| 10,033,934 B2 * | 7/2018 | Wang .................. H04N 5/2254 |
| 2010/0245066 A1 | 9/2010 | Sarioglu et al. |
| 2014/0354878 A1* | 12/2014 | Winter ................ H04N 5/2252 |
| | | 348/374 |
| 2017/0222311 A1 | 8/2017 | Hess et al. |
| 2017/0254873 A1 | 9/2017 | Koravadi |
| 2017/0276788 A1 | 9/2017 | Wodrich |
| 2017/0315231 A1 | 11/2017 | Wodrich |
| 2017/0356994 A1 | 12/2017 | Wodrich et al. |
| 2018/0015875 A1 | 1/2018 | May et al. |
| 2018/0045812 A1 | 2/2018 | Hess |
| 2018/0231635 A1 | 8/2018 | Woehlte |
| 2020/0137926 A1 | 4/2020 | Wohlte |

* cited by examiner

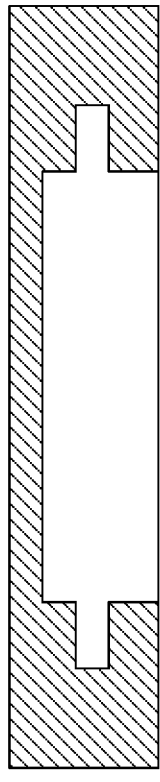
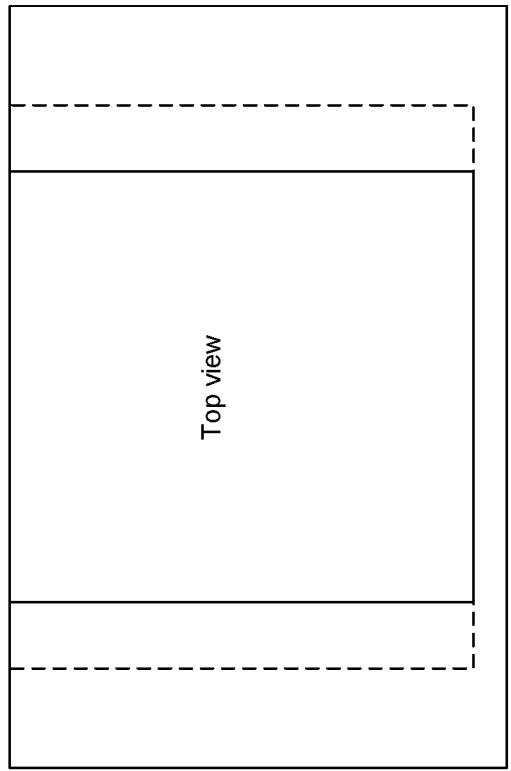
FIG. 7A
FIG. 7C
FIG. 7B
FIG. 7D
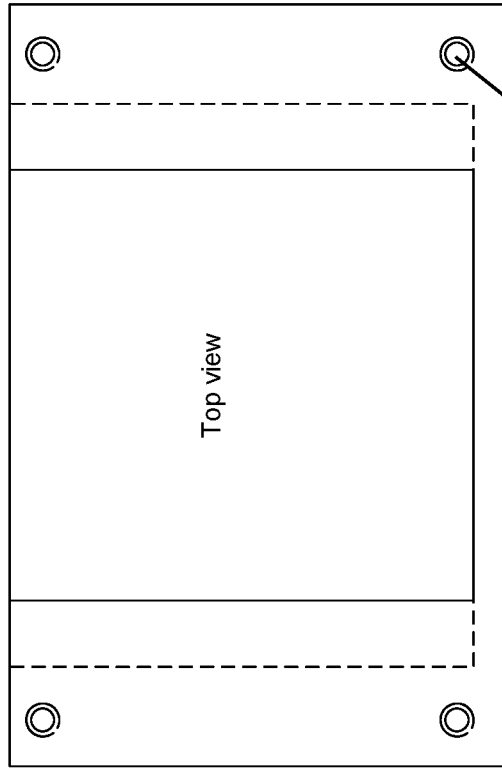

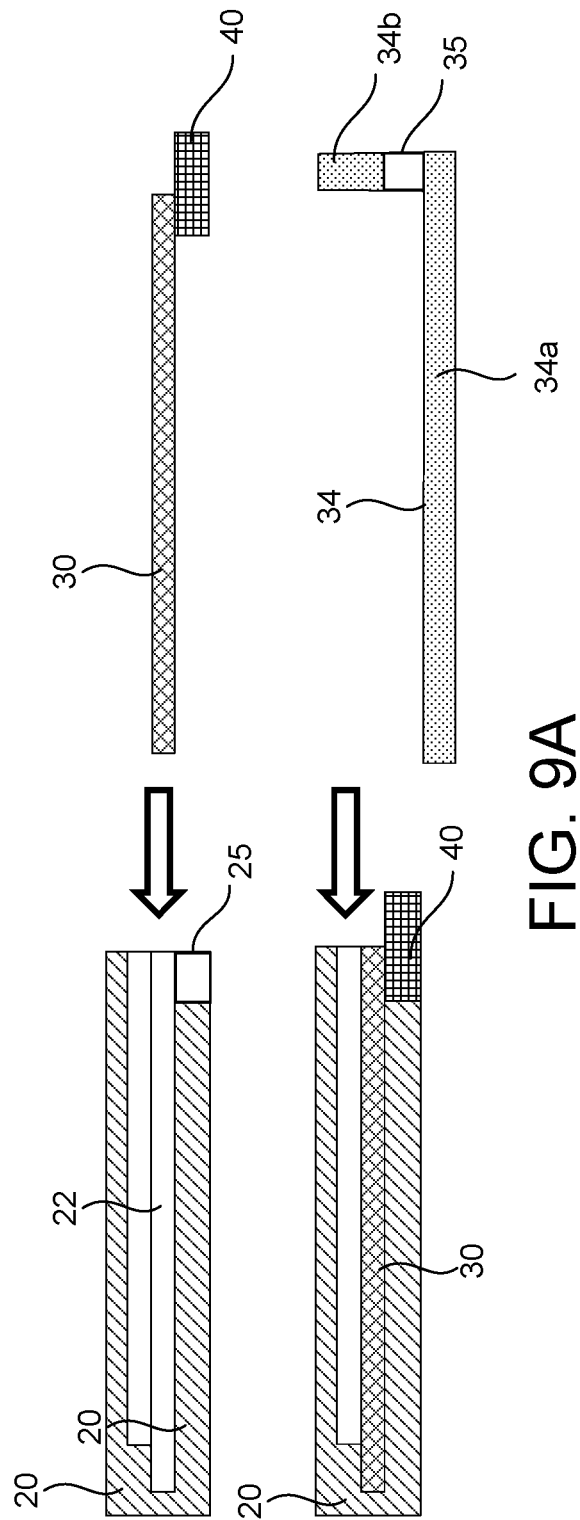
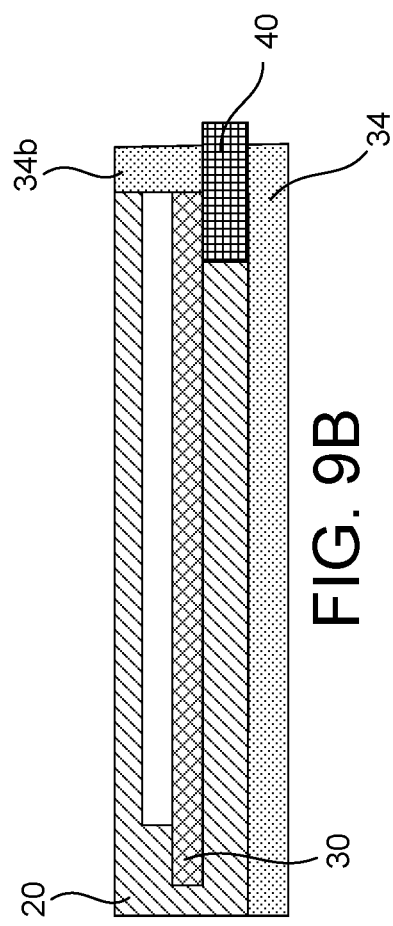
FIG. 9A
FIG. 9B

VEHICULAR RADAR SENSOR WITH ENHANCED HOUSING AND PCB CONSTRUCTION

CROSS REFERENCE TO RELATED APPLICATION

The present application claims the filing benefits of U.S. provisional application Ser. No. 62/751,940, filed Oct. 29, 2018, which is hereby incorporated herein by reference in its entirety.

FIELD OF THE INVENTION

The present invention relates generally to a vehicle sensing system for a vehicle and, more particularly, to a vehicle sensing system that utilizes one or more radar sensors at a vehicle.

BACKGROUND OF THE INVENTION

Use of imaging and radar sensors in vehicle sensing systems is common and known. Examples of such known systems are described in U.S. Pat. No. 8,013,780, which is hereby incorporated herein by reference in its entirety.

SUMMARY OF THE INVENTION

The present invention provides a driver assistance system or vision system or imaging system for a vehicle that utilizes one or more radar sensors to capture sensor data representative of images exterior of the vehicle. The sensor includes a housing structure and at least one printed circuit board (PCB). The housing structure includes a front housing and a rear or back housing. The PCB is received in a respective slot along opposite side walls of the front housing and, after each PCB is received in the respective slot, the front housing and the rear housing are joined to form the housing structure and to retain the PCB in the slot of the front housing.

These and other objects, advantages, purposes and features of the present invention will become apparent upon review of the following specification in conjunction with the drawings.

BRIEF DESCRIPTION OF THE DRAWINGS

FIGS. 7A-7D are cross-sectional and plan views of front housings with and without threads for screws;

FIGS. 9A and 9B are plan views of example assembly of housing structures and PCBs in accordance with the present invention.

DESCRIPTION OF THE PREFERRED EMBODIMENTS

A vehicle sensing system and/or driver assist system and/or driving assist system and/or object detection system and/or alert system operates to capture sensing data exterior of the vehicle and may process the captured data to detect objects at or near the vehicle and in the predicted path of the vehicle, such as to assist a driver of the vehicle or a control for an autonomous vehicle in maneuvering the vehicle in a forward or rearward direction. The system includes a processor that is operable to receive sensing data from one or more sensors and provide an output, such as an alert or control of a vehicle system.

Figure 1:
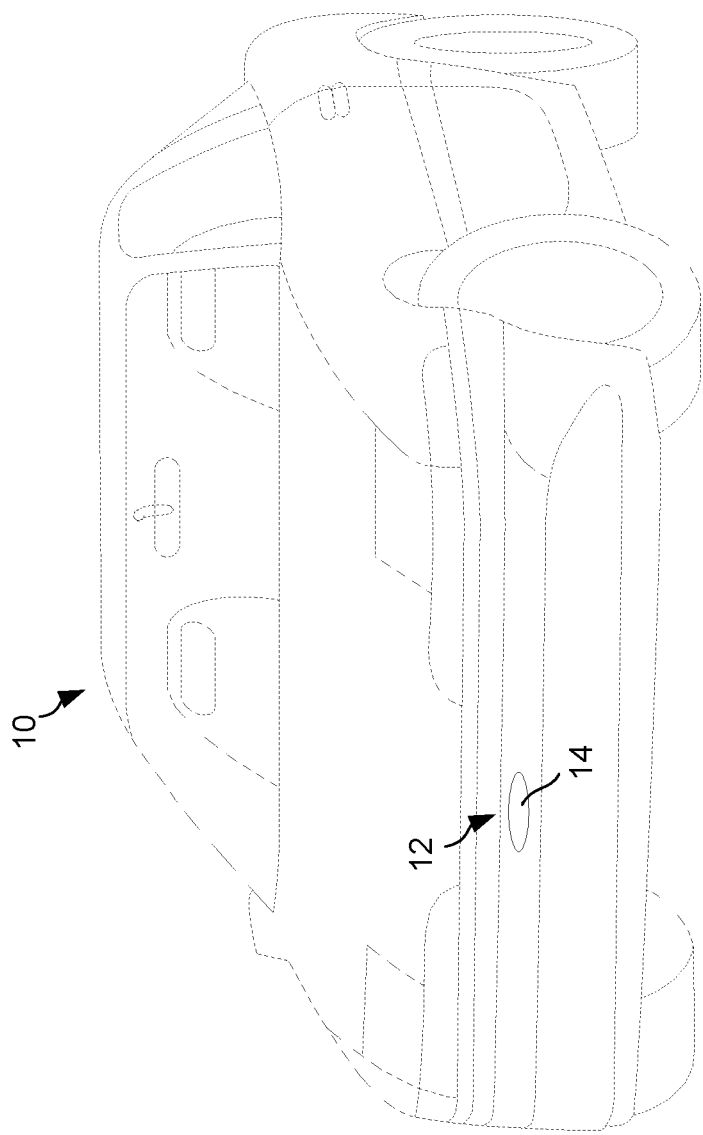
FIG. 1 is a perspective view of a vehicle with a sensing system that incorporates a radar sensor in accordance with the present invention.

Referring now to the drawings and the illustrative embodiments depicted therein, a vehicle 10 (FIG. 1) includes a driving assistance system or sensing system 12 that includes at least one radar sensor unit, such as a forward facing radar sensor unit 14 (and the system may optionally include multiple exterior facing sensors, such as cameras or other sensors, such as a rearward facing sensor at the rear of the vehicle, and a sideward/rearward facing sensor at respective sides of the vehicle), which sense regions exterior of the vehicle. The sensing system 12 includes a control or electronic control unit (ECU) or processor that is operable to process data captured by the sensor or sensors and may detect objects or the like. The data transfer or signal communication from the sensor to the ECU may comprise any suitable data or communication link, such as a vehicle network bus or the like of the equipped vehicle.

The radar sensor or sensors of the driving assist system may be used in conjunction with a plurality of image sensors mounted at the equipped vehicle and/or with at least one lidar sensor also mounted (along with the image sensors and the radar sensor) at the equipped vehicle. Image data and radar data and lidar data are provided to a central electronic control unit (ECU) or module for processing thereat. The ECU includes at least one processor that processes the captured/sensed data, whereby one or more functions or systems (such as a braking system and/or steering system and/or the like) of the vehicle is controlled responsive to processing of the captured/sensed data.

Automotive RADAR sensors are space sensitive. Antennas of the sensors typically face a front housing. The front housing is generally constructed of plastic. Integrated circuits (ICs), systems on a chip (SoCs), and other processors generate heat on printed circuit boards (PCBs) disposed within or behind the front housing that often are managed via thermally coupling to a heat sink. For example, when necessary, a rear or back housing of the RADAR sensor includes a heat sink (such as a plurality of fins or tabs or structure protruding rearward from the rear wall of the rear housing portion). The rear housing may then be used for heat transfer and tolerance compensation. A thermal pad or thermal grease is often used between a hot spot of the PCB and the heat sink. It is difficult to meet these thermal constraints in a re-usable and quickly adaptable design, as assembly time is typically a cost driver in production.

Figure 2:
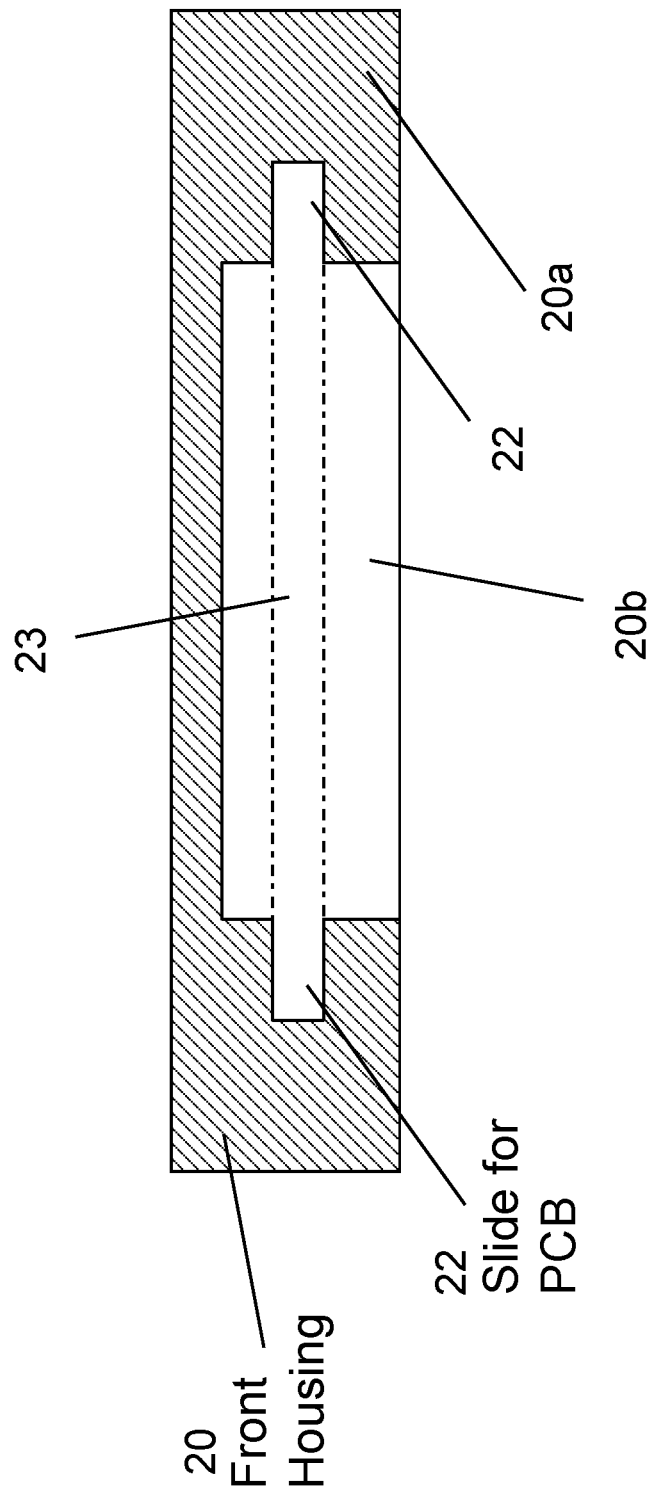
FIG. 2 is a plan view of a front housing of the radar sensor in accordance with the present invention.

As shown in FIG. 2, a front housing 20 of sensor 14 includes a slide or groove or slot 22, such as along opposite side walls 20a of the front housing. The slot 22 is generally the same width and thickness of a PCB of the radar sensor 14, and the PCB is slid into or disposed within the slot 22 of the front housing 20. The PCB comprises a rectangular substrate that includes four perimeter or periphery edge regions, with the perimeter edge regions including side perimeter regions along opposite perimeter sides of the PCB and end perimeter regions along opposite perimeter ends of the PCB. The PCB is slid into the front housing 20 (such as end-first) with the side perimeter regions of the PCB being received in and along the respective slots along, for example, the side walls of the front housing 20. Optionally, an end wall 20b of the front housing 20 may have a slot 23 (FIG. 2) established thereat, whereby an end perimeter region of the PCB is inserted into and received in the slot 23 when the PCB has been slid along the slots 22 of the side walls 20a of the front housing and fully inserted into the front housing. The front housing 20 may be made of plastic or other non-conducting material.

Figure 3B:
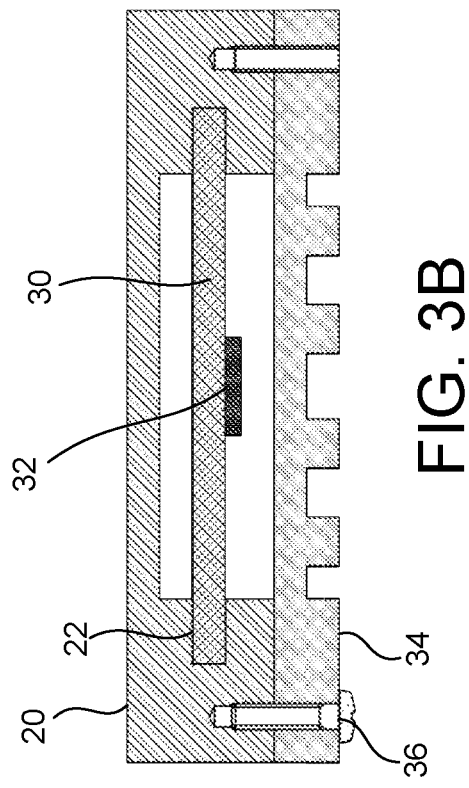
FIGS. 3A-3D are plan views of a housing structures and printed circuit boards (PCBs) of the radar sensor in accordance with the present invention.
Figure 3D:
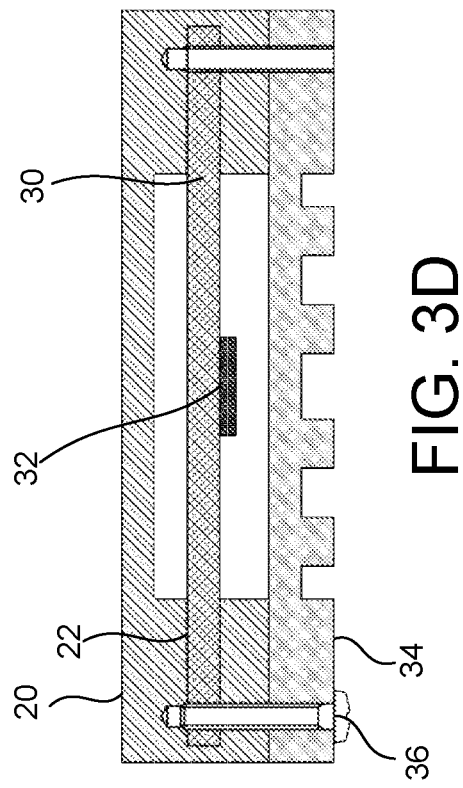
Figure 3A:
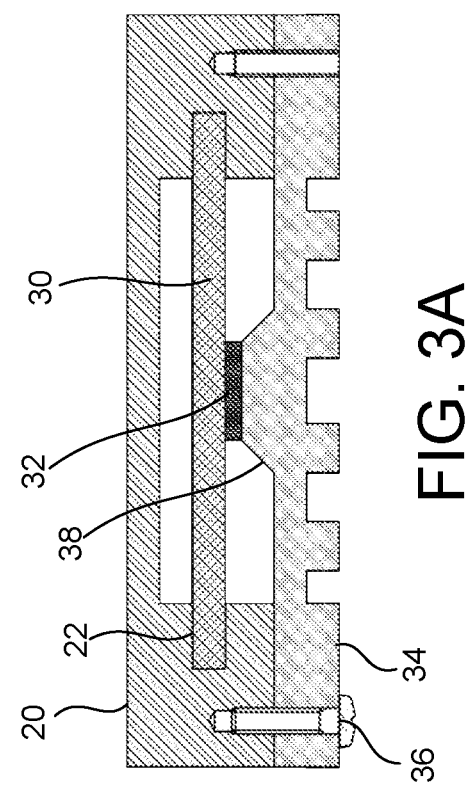
Figure 3C:
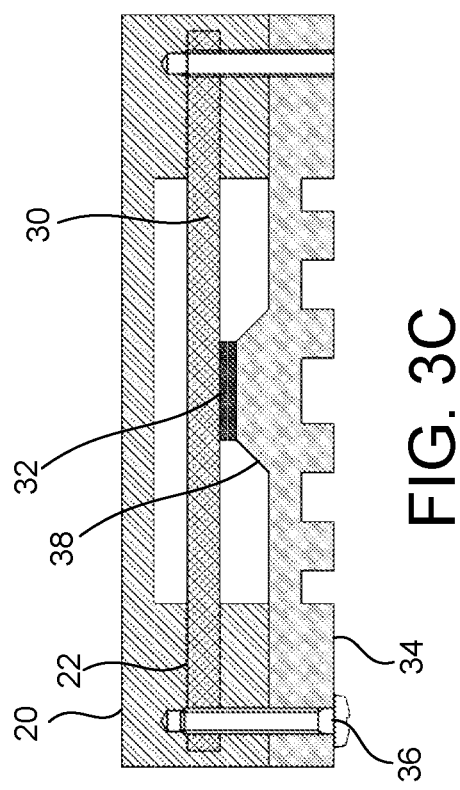
Figure 4:
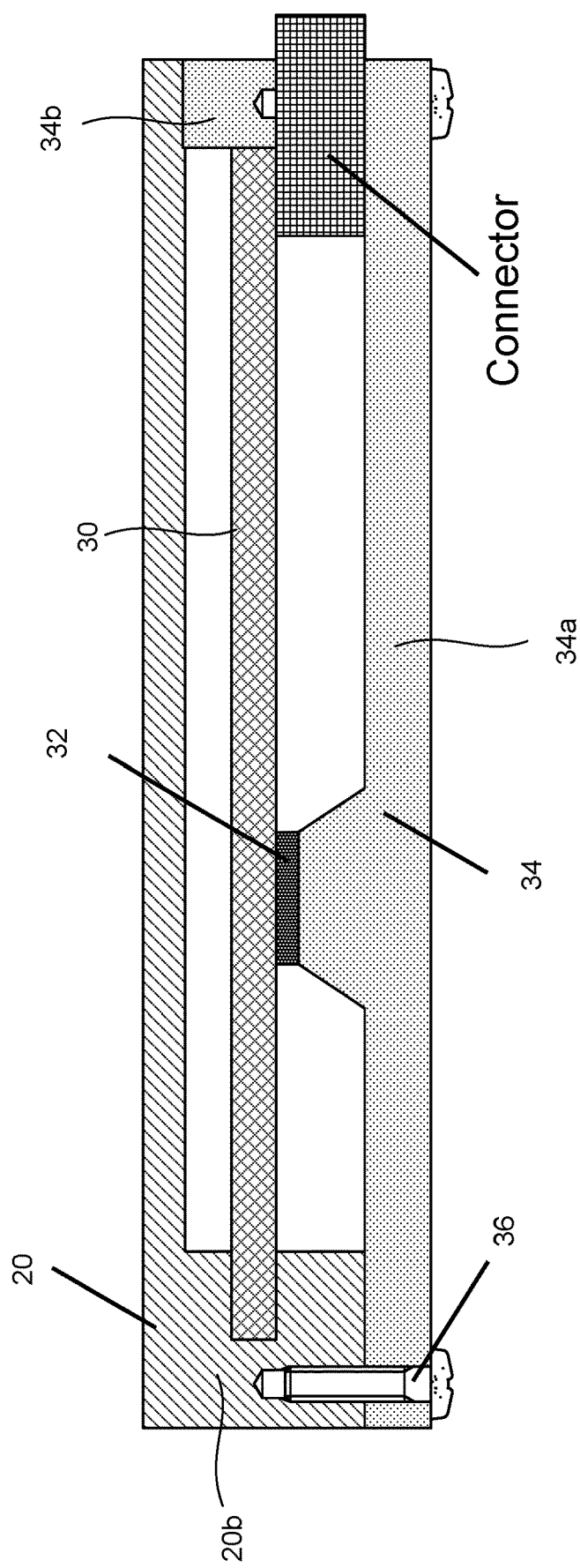
FIG. 4 is a plan view of another housing structure and PCB with a metallic rear housing.

Referring now to FIGS. 3A-3D and 4, after a PCB 30 (which may include a data processor or IC with a hot spot 32) has been slid into the slot 22 of front housing 20, a back housing or rear housing or plate 34 may be attached or joined to the front housing 20 to establish a cavity in which the PCB 30 is disposed. As shown in FIG. 4, the rear housing 34 may comprise a generally L-shaped construction having a rear wall 34a and an end wall 34b, with the end wall 34b, when the rear housing 34 is joined with the front housing 20, covering or closing over each slot at the ends of the side walls of the front housing to preclude removal of each PCB 30 from the slots and front housing 20. The PCB may be sized such that, when fully inserted into the front housing, the trailing end of the PCB is flush with the open end of the front housing, such that the end wall 34b of the rear housing, when joined with the front housing, abuts against the trailing end of the PCB to maintain the PCB in the housing and limit or preclude movement of the PCB along the slots. As shown in FIG. 4, the end wall 20b of the front housing may have a slot thereat to receive the inserted end or leading end of the PCB when the PCB is fully inserted or received at the front housing.

The rear housing 34 may be attached to the front housing 20 via, for example, threaded fasteners or screws 36. The depth of the slots (and width of the PCB) may be such that the screws 36, when threaded into the rear housing and front housing, electrically couple or connect the rear housing 34 to circuitry of the PCB 30 (FIGS. 3C and 3D). Other forms of attaching or fusing the front housing 20 and the rear housing 34 may be used. For example, the front housing 20 and rear housing 34 may be welded or glued together or held with other fasteners (anchors, bolts, etc.).

In some examples, the rear housing 34 may attach to or engage the hot spot 32 of the PCB 30 via a pedestal 38 (FIGS. 3A and 3C). The pedestal 38 and rear housing 34 may be metallic (such as aluminum, zinc or magnesium or alloys thereof) to improve heat transfer from the hot spot 32. For example, the rear housing and pedestal may utilize aspects of the housings and pedestals described in U.S. patent application Ser. No. 16/662,205, filed Oct. 24, 2019, now published as U.S. Publication No. US-2020-0137926, which is hereby incorporated herein by reference in its entirety.

Figure 5:
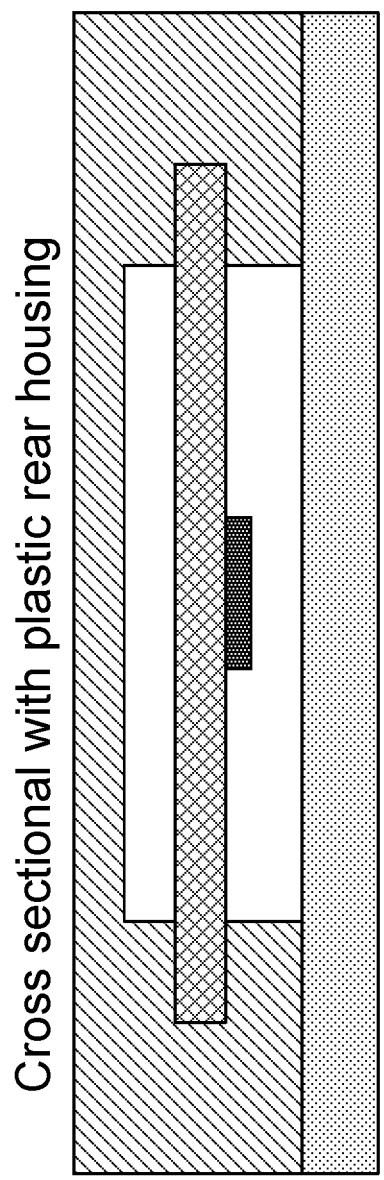
FIG. 5 is a plan view of another housing structure and PCB with a plastic rear housing.
Figure 6:
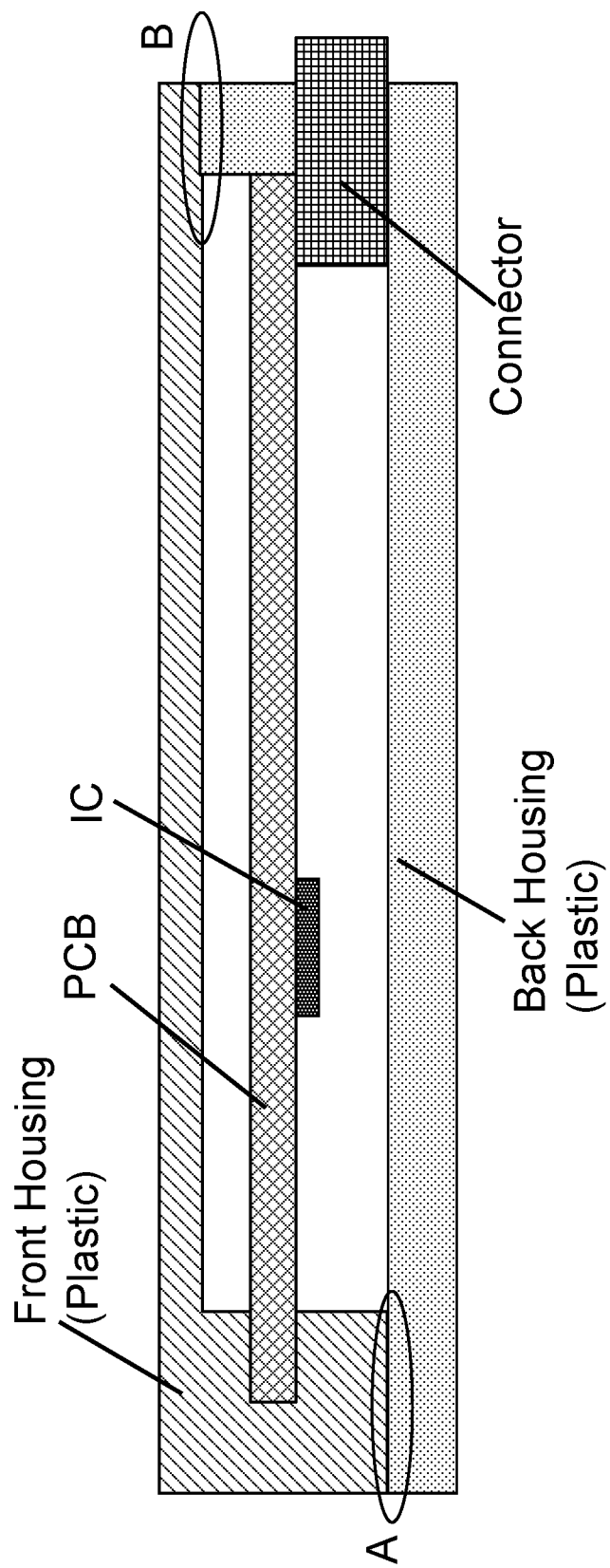
FIG. 6 is a plan view of another housing structure and PCB with a plastic rear housing.

In some examples, the rear housing 34 (such as at the end wall 34b of the rear housing 34) includes an opening for a connector (see FIG. 4 and FIGS. 9A and 9B). For example, the opening may allow for an electrical connector to pass through for electrical connection to a wire harness of the vehicle. The electrical connector may be disposed on the PCB and attached to the rear housing portion after joining the rear housing to the front housing. The connector may be preassembled with the PCB 30 (such as at the end of the PCB substrate that is opposite from the end that is inserted into the front housing) prior to insertion into the front housing 20. The connector may be, for example, screwed to the rear housing 34. As shown in FIG. 5, the rear housing 34 may also be made of plastic or other materials when thermal requirements allow. Referring now to FIG. 6, the rear housing, when made of plastic, may be joined to the front housing via, for example, welding or gluing, with the areas A and B being areas of welding, gluing or other suitable technique to connect the plastic housing portions. As previously discussed, the rear housing, regardless of the material, may provide an opening for a connector to mate with the PCB.

Figure 8B:
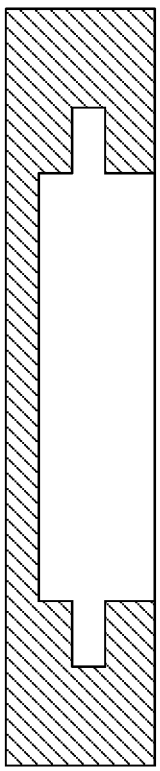
FIGS. 8A and 8B are cross-sectional views of a front housing in accordance with the present invention.
Figure 8A:
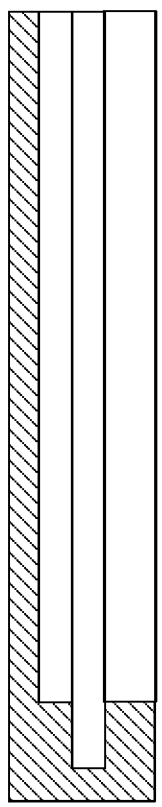

FIGS. 7A and 7C provide cross-sectional views of a front housing with threaded screws (FIG. 7A) and without threaded screws (FIG. 7C). FIG. 7B illustrates a top view of the front housing of FIG. 7A, with screw holes, while FIG. 7D illustrates the front housing of FIG. 7C, without screw holes. As can be seen with reference to FIGS. 7A-D, the front housing has the slots formed along the side walls from an open end of the front housing (at which the PCB is inserted) to a closed end of the front housing opposite the open end. The PCB, when inserted into the front housing, may seat against or abut against the closed end of the front housing (with the trailing end region of the PCB being at the open end of the front housing) or the inserted end of the PCB may be received within a slot or recess formed along the closed end of the front housing, such that the PCB is supported and received in a slot along three of its side/end regions. FIGS. 8A and 8B illustrate a cross-sectional top view (FIG. 8A) and a cross-sectional side view (FIG. 8B) of the front housing. FIGS. 9A and 9B illustrate an example assembly without the use of screws.

As shown in FIG. 9A, the PCB 30 is slid into slot 22 of the front housing 20. In the illustrated embodiment of FIGS. 9A and 9B, the front housing portion includes a lower portion that defines the cavity, and the PCB is slid along the slots into the cavity. The lower portion of the front housing may have a cutout or notch 25 that is configured to receive the connector 40 of the PCB 30 when the PCB is inserted into and along the slots 22. After the PCB 30 is seated (such as with an end perimeter region or edge of the PCB being received in a slot at the end wall of the front housing or with the end perimeter region or edge of the PCB abutting or engaging the end wall of the front housing), the rear housing 34 is joined to the front housing 20. The rear housing 34 includes the rear wall 34a and the end wall 34b (FIG. 9A), with the end wall 34b, when the rear housing is joined with the front housing 20, covering or closing over each slot 22 at the ends of the side walls of the front housing to preclude removal of each PCB 30 (see FIG. 9B). An opening 35 through the end wall 34b of the rear housing 34 may allow for the connector 40 to pass through. A connector 40 may be disposed at the PCB 30 and attached to the rear housing 34 after joining.

Optionally, the radar sensor 14 may include a plurality of PCBs 30. The front housing 20 may include a separate slot 22 for each PCB 30. The front housing 20 may also include a single slot wide enough to accept a "stack" of PCBs 30 (i.e., the PCBs connected together via board-to-board connectors). All of the PCBs 30 may then be slid into the front housing 20 simultaneously. Once slid into place, the PCB(s) 30 may be held in place via dedicated geometries in the front housing 20 and/or rear housing 34 (where each of the two housings are formed to partially circumscribe the PCB, such that, when assembled together, the front and rear housings combine to fully circumscribe the PCB and retain the PCB in the slot of the front housing).

Thus, the present invention provides a modular design that simplifies assembly by allowing a PCB to slide into a front housing prior to attaching a rear housing to the front housing. After the PCB is disposed at or slid into and received in the slots, the rear housing attaches to the front housing, with a portion of the rear housing covering or blocking the entry of the slots at the side walls of the front housing so that, when the rear housing is attached at the front housing, the PCB is retained in the slot and in the cavity of the housing. For example, the front housing may have three walls (such as opposite side walls and an end wall), with the slot or groove or channel formed along each of the side walls (and optionally at the end wall). When the PCB is disposed in and supported at the front housing side walls, the rear housing is attached at the front housing. The rear housing includes a side wall that, when the rear housing is attached at the front housing, acts as a fourth wall (a second end wall that is opposite the end wall of the front housing) of the housing construction and covers the entry of the side wall slot(s) and precludes removal of the PCB. Optionally, the front housing may have two opposite side walls (with a slot along each front housing side wall) and the rear housing may have two opposite side walls (with no slots formed therealong), such that, when the front and rear housings are assembled together (after the PCB is slid into the slots of the front housing side walls), the four side walls circumscribe the PCB, with the side walls of the rear housing blocking the ends of the slots of the front housing side walls. Optionally, the slot or slots may be formed in the walls of the rear housing, with the side wall or side walls of the front housing functioning to retain the PCB in the slot of the rear housing when the front housing is attached at the rear housing. The present invention allows for fast reaction to thermal and other problems by making adaptations to the housing (as opposed to changing the PCB). This allows the PCB to remain unchanged.

The vehicle may include any type of sensor or sensors, such as imaging sensors or radar sensors or lidar sensors or ultrasonic sensors or the like. For example, the system may utilize radar or lidar sensors or the like, and may utilize aspects of the systems described in U.S. Pat. Nos. 9,753,121; 9,689,967; 9,599,702; 9,575,160; 9,146,898; 9,036,026; 8,027,029; 8,013,780; 6,825,455; 7,053,357; 7,408,627; 7,405,812; 7,379,163; 7,379,100; 7,375,803; 7,352,454; 7,340,077; 7,321,111; 7,310,431; 7,283,213; 7,212,663; 7,203,356; 7,176,438; 7,157,685; 6,919,549; 6,906,793; 6,876,775; 6,710,770; 6,690,354; 6,678,039; 6,674,895 and/or 6,587,186, and/or International Publication Nos. WO 2018/007995 and/or WO 2011/090484, and/or U.S. Publication Nos. US-2018-0231635; US-2018-0045812; US-2018-0015875; US-2017-0356994; US-2017-0315231; US-2017-0276788; US-2017-0254873; US-2017-0222311 and/or US-2010-0245066, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular radar sensing system, the vehicular radar sensing system comprising:
    a radar sensor disposed at a vehicle so as to sense exterior of the vehicle;
    wherein the radar sensor comprises a housing and a printed circuit board (PCB);
    wherein the PCB has side perimeter regions along opposite perimeter sides of the PCB and end perimeter regions along opposite perimeter ends of the PCB;
    wherein the housing comprises a front housing portion and a rear housing portion;
    wherein the front housing portion comprises a first surface, a second surface, and side walls extending from the first surface to the second surface;
    wherein each of the side walls has a slot extending therealong and spaced from the first surface and the second surface;
    wherein the side perimeter regions of the PCB are received in and along respective slots along the side walls of the front housing portion;
    wherein, with the side perimeter regions of the PCB received in and along the slots along the side walls of the front housing portion, the front housing portion and the rear housing portion are joined together to establish a cavity in which the PCB is disposed; and
    wherein the rear housing portion, when joined with the front housing portion, covers an end of each of the slots along the side walls of the front housing portion to preclude removal of the PCB from the slots and from the front housing portion.

2. The vehicular radar sensing system of claim 1, wherein an end wall of the front housing portion has an end slot, and wherein an end perimeter region of the PCB is received in the end slot.

3. The vehicular radar sensing system of claim 1, wherein the front housing portion and the rear housing portion are joined via at least one fastener.

4. The vehicular radar sensing system of claim 3, wherein the at least one fastener electrically couples the rear housing portion and circuitry of the PCB.

5. The vehicular radar sensing system of claim 1, wherein the rear housing portion comprises a pedestal, and wherein the pedestal is thermally coupled to the PCB to conduct heat away from the PCB and to the rear housing portion.

6. The vehicular radar sensing system of claim 1, wherein the rear housing portion comprises an opening, and wherein the opening provides for an electrical connector to pass through for electrical connection to a wire harness of the vehicle when the radar sensor is disposed at the vehicle.

7. The vehicular radar sensing system of claim 6, wherein the electrical connector is disposed on the PCB and the electrical connector is attached to the rear housing portion after joining the rear housing portion and the front housing portion.

8. The vehicular radar sensing system of claim 1, wherein the radar sensor comprises a plurality of PCBs, and wherein the perimeter regions of each PCB of the plurality of PCBs are received in respective slots of the front housing portion.

9. The vehicular radar sensing system of claim 1, wherein the front housing portion comprises a plastic material.

10. The vehicular radar sensing system of claim 1, wherein the rear housing portion comprises a metallic material.

11. A method of assembling a vehicular radar sensor for a vehicular radar sensing system, the method comprising:
    providing a front housing portion and a rear housing portion, wherein the front housing portion comprises a first surface, a second surface, opposite side walls, and an end wall, and wherein each of the opposite side walls of the front housing portion extend from the first surface to the second surface, and wherein each side wall of the opposite side walls has a slot extending therealong and spaced from the first surface and the second surface;

providing a printed circuit board (PCB) having side perimeter regions along opposite sides of the PCB and end perimeter regions along opposite ends of the PCB;

sliding the PCB into the front housing portion, wherein the side perimeter regions slide along the slots along the respective side walls of the front housing portion;

after the side perimeter regions of the PCB are received in the slots along the opposite side walls of the front housing portion, joining the rear housing portion to the front housing portion to establish a cavity in which the PCB is disposed; and wherein joining the rear housing portion to the front housing portion comprises positioning an end wall of the rear housing portion at an end of each of the slots to preclude removal of the PCB from the slots and from the front housing portion.

12. The method of claim 11, wherein the end wall of the front housing portion has a slot, and wherein sliding the PCB into the front housing portion comprises sliding an end perimeter region of the PCB into the slot at the end wall of the front housing portion.

13. The method of claim 11, wherein joining the rear housing portion to the front housing portion comprises fastening the rear housing portion to the front housing portion via at least one fastener.

14. The method of claim 13, wherein the at least one fastener electrically couples the rear housing portion and circuitry of the PCB.

15. The method of claim 13, wherein the rear housing portion comprises an opening, and wherein the opening provides for an electrical connector to pass through when the rear housing portion is joined to the front housing portion, and wherein the electrical connector is configured electrical connection to a wire harness of a vehicle when the radar sensor is disposed at the vehicle.

16. The method of claim 15, wherein the electrical connector is disposed on the PCB and the electrical connector is attached to the rear housing portion after joining the rear housing portion to the front housing portion.

17. The method of claim 13, wherein the front housing portion comprises a plastic material.

18. The method of claim 13, wherein the rear housing portion comprises a metallic material.

19. A vehicular radar sensing system, the vehicular radar sensing system comprising:

a radar sensor disposed at a vehicle so as to sense exterior of the vehicle;

wherein the radar sensor comprises a housing and a printed circuit board (PCB);

wherein the PCB has side perimeter regions along opposite perimeter sides of the PCB and end perimeter regions along opposite perimeter ends of the PCB;

wherein the housing comprises a first housing portion and a second housing portion;

wherein the first housing portion comprises a first surface, a second surface, and side walls extending from the first surface to the second surface;

wherein each of the side walls has a slot extending therealong and spaced from the first surface and the second surface;

wherein the side perimeter regions of the PCB are received in and along respective slots along the side walls of the first housing portion;

wherein an end wall of the first housing portion has an end slot, and wherein an end perimeter regions of the PCB is received in the end slot;

wherein, with the side perimeter regions and end perimeter region of the PCB received in and along the slots along the side walls and end wall of the first housing portion, the first housing portion and the second housing portion are joined together to establish a cavity in which the PCB is disposed;

wherein the first housing portion and the second housing portion are joined via at least one fastener; and wherein the second housing portion, when joined with the first housing portion, covers an end of each of the slots along the side walls of the first housing portion to preclude removal of the PCB from the slots and from the first housing portion.

20. The vehicular radar sensing system of claim 19, wherein the second housing portion comprises a pedestal, and wherein the pedestal is thermally coupled to the PCB to conduct heat away from the PCB and to the second housing portion.

21. The vehicular radar sensing system of claim 19, wherein the at least one fastener that joins the first housing portion and the second housing portion electrically couples the second housing portion to circuitry of the PCB.

* * * * *